(12) United States Patent
Suzuki

(10) Patent No.: US 10,160,119 B2
(45) Date of Patent: Dec. 25, 2018

(54) ROBOT SYSTEM

(71) Applicant: Fanuc Corporation, Yamanashi (JP)

(72) Inventor: Yuuji Suzuki, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 141 days.

(21) Appl. No.: 15/450,309

(22) Filed: Mar. 6, 2017

(65) Prior Publication Data

US 2017/0282378 A1 Oct. 5, 2017

(30) Foreign Application Priority Data

Mar. 30, 2016 (JP) ................................. 2016-067547

(51) Int. Cl.
| | |
|---|---|
| *G06F 19/00* | (2018.01) |
| *B25J 15/04* | (2006.01) |
| *G01D 5/14* | (2006.01) |
| *H05K 9/00* | (2006.01) |
| *B25J 13/08* | (2006.01) |

(52) U.S. Cl.
CPC ......... *B25J 15/0491* (2013.01); *B25J 13/087* (2013.01); *G01D 5/14* (2013.01); *H05K 9/0064* (2013.01)

(58) Field of Classification Search
CPC ....... B25J 15/0491; B25J 13/087; G01D 5/14; H05K 9/0064
USPC .......................................................... 700/245
See application file for complete search history.

(56) References Cited

U.S. PATENT DOCUMENTS

| | | | |
|---|---|---|---|
| 4,875,275 A | 10/1989 | Hutchinson et al. | |
| 8,855,818 B2* | 10/2014 | Hashimoto | B25J 13/087 |
| | | | 700/245 |
| 9,085,084 B2* | 7/2015 | Staab | B25J 13/087 |
| 9,481,091 B2* | 11/2016 | Suzuki | B25J 9/1697 |
| 9,713,902 B2* | 7/2017 | Susnjara | B29C 64/106 |
| 9,718,193 B1* | 8/2017 | Sleator | H03D 3/02 |

(Continued)

FOREIGN PATENT DOCUMENTS

| | | |
|---|---|---|
| CN | 103406915 A | 11/2013 |
| CN | 105128022 A | 12/2015 |
| DE | 202015105137 U1 | 10/2015 |

(Continued)

OTHER PUBLICATIONS

Japanese Office Action, Decision to Grant a Patent dated Mar. 20, 2018 for Japanese Patent Application No. 2016-067547.

*Primary Examiner* — Ronnie M Mancho

(74) *Attorney, Agent, or Firm* — Winstead PC

(57) ABSTRACT

A robot system comprising: a robot having an attaching/detaching mechanism; a controller; and a hand stand on which hands are put and includes a ground circuit for electrically grounding the hands, wherein a first electrode to which detection voltage is applied is fixed to the robot, each of the hands has a reference position used when the hand is attached to the attaching/detaching mechanism, and is provided with a second electrode so that distance from the reference position to the second electrode differs for each hand, a detecting unit for detecting current in the ground circuit is provided, the controller includes: a storage that stores the types of the hands and those corresponding positions of the second electrodes, and a hand identifying unit that identifies whether the hand is a selected hand based on the current when the first electrode is moved to a position of the second electrode.

5 Claims, 5 Drawing Sheets

(56) References Cited

U.S. PATENT DOCUMENTS

2012/0298706 A1 11/2012 Gordon et al.
2017/0057085 A1* 3/2017 Cookson ................. B25J 9/08

FOREIGN PATENT DOCUMENTS

| JP | S59-097884 A | 6/1984 |
| JP | S59-232781 A | 12/1984 |
| JP | S62-106779 U | 7/1987 |
| JP | S63-288688 A | 11/1988 |
| JP | 2012-035391 A | 2/2012 |

* cited by examiner

ROBOT SYSTEM

CROSS-REFERENCE TO RELATED APPLICATIONS

This application is based on Japanese Patent Application No. 2016-067547 filed on Mar. 30, 2016, the content of which is incorporated herein by reference.

TECHNICAL FIELD

The present invention relates to a robot system.

BACKGROUND ART

Conventionally, when one uses a changer such as an auto tool changer (ATC) attached to the distal end of the wrist of a robot to perform multiple different operations while changing the hand with multiple hands, he/she needs to check whether the hand attached is suitable for each operation or not each time it happens. As a method for identifying whether a mounted hand is correct or not, an identification method using a camera is known (for example, see PTL 1). Furthermore, installing many sensors for hand identification on a hand stand is also conceivable.

CITATION LIST

Patent Literature

{PTL 1}
Japanese Unexamined Patent Application, Publication No. 2012-35391

SUMMARY OF INVENTION

An aspect of the present invention is to provide a robot system that includes a robot having a hand attaching/detaching mechanism at a distal end of a wrist thereof; a controller for controlling the robot; and a hand stand on which several types of hands to be voluntarily attached to the hand attaching/detaching mechanism of the robot are put and which includes a ground circuit that electrically grounds the hands put on the hand stand to the ground, wherein a first electrode to which detection voltage is applied is fixed to the distal end of the wrist of the robot, wherein each of the hands has a reference position to be a reference when the hand is attached to the hand attaching/detaching mechanism, and is provided with a second electrode so that distance from the reference position to the second electrode differs for each hand, wherein the robot system further comprises a current detecting unit for detecting electric current flowing into the ground circuit of the hand stand, wherein the controller includes: a hand selecting unit for selecting one of the hands; a storage unit that stores the types of the hands and positions of the second electrodes so that the types are associated with the positions, and a hand identifying unit that makes the robot operate to move the first electrode toward each one of the hands put on the hand stand and identifies whether or not the hand is a selected hand selected by the hand selecting unit on the basis of whether or not the electric current is detected by the current detecting unit when the first electrode has been moved to a position corresponding to the position of the second electrode of the selected hand.

DESCRIPTION OF EMBODIMENTS

A robot system 1 according to an embodiment of the present invention is explained below with reference to the drawings.

Figure 1:
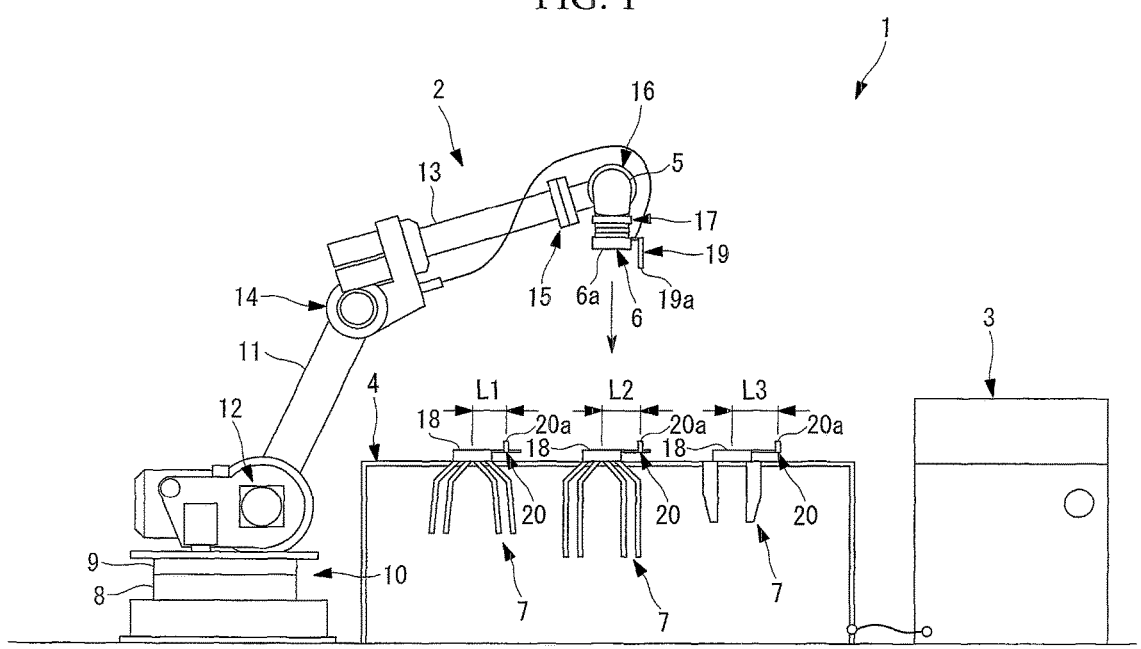
FIG. 1 is an entire configuration diagram showing a robot system according to an embodiment of the present invention.

As shown in FIG. 1, the robot system 1 according to the present embodiment includes a robot 2 with a hand attaching/detaching mechanism 6 at the distal end 5 of the wrist, a controller 3 for controlling the robot 2, and a hand stand 4 on which several types of hands 7 are placed.

The robot 2 is, for example, a six-axis articulated robot, and includes a first axis 10 for rotating a revolving body 9 around a vertical axis line with respect to a base 8 fixed to the ground, a second axis 12 for swinging a first arm 11 around a horizontal axis line with respect to the revolving body 9, a third axis 14 for swinging a second arm 13 swingably attached to the distal end of the first arm 11 so that the second arm 13 can swing around a horizontal axis line, a fourth axis 15 for rotating the wrist around a longitudinal axis of the second arm 13 at the distal end of the second arm 13, a fifth axis 16 for swinging the distal end 5 of the wrist around an axis line perpendicular to the longitudinal axis of the second arm 13 at the distal end of the fourth axis 15, and a sixth axis 17 for rotating the hand attaching/detaching mechanism 6 around an axis line perpendicular to the axis line of the fifth axis 16 at the distal end of the fifth axis 16.

By installing a common attaching/detaching unit 18 in each of the hands 7, the hand attaching/detaching mechanism 6 can be alternatively fitted with any of the hands 7 by the attaching/detaching unit 18. There are various well-known structures as the structure of the attaching/detaching unit 18. In the present embodiment, the structure of the attaching/detaching unit 18 can be any of these. The hand attaching/detaching mechanism 6 is configured to be able to be fitted with the attaching/detaching unit 18 of any hand 7 by bringing the reference position of the hand attaching/detaching mechanism 6 to be aligned with the reference position of the attaching/detaching unit 18.

A first electrode 19 is fixed to the distal end 5 of the wrist of the robot 2. In an example shown in FIG. 1, the first electrode 19 is a rod-like electrode placed parallel to and at a predetermined distance from an axis line of the sixth axis 17, and has a contact surface 19a on its distal end. The contact surface 19a is to be electrically connected to a second electrode 20 which is described later. The contact surface 19a is placed at the position where the contact surface 19a protrudes to the distal end side relative to a distal end surface 6a of the hand attaching/detaching mechanism 6.

Figure 3:
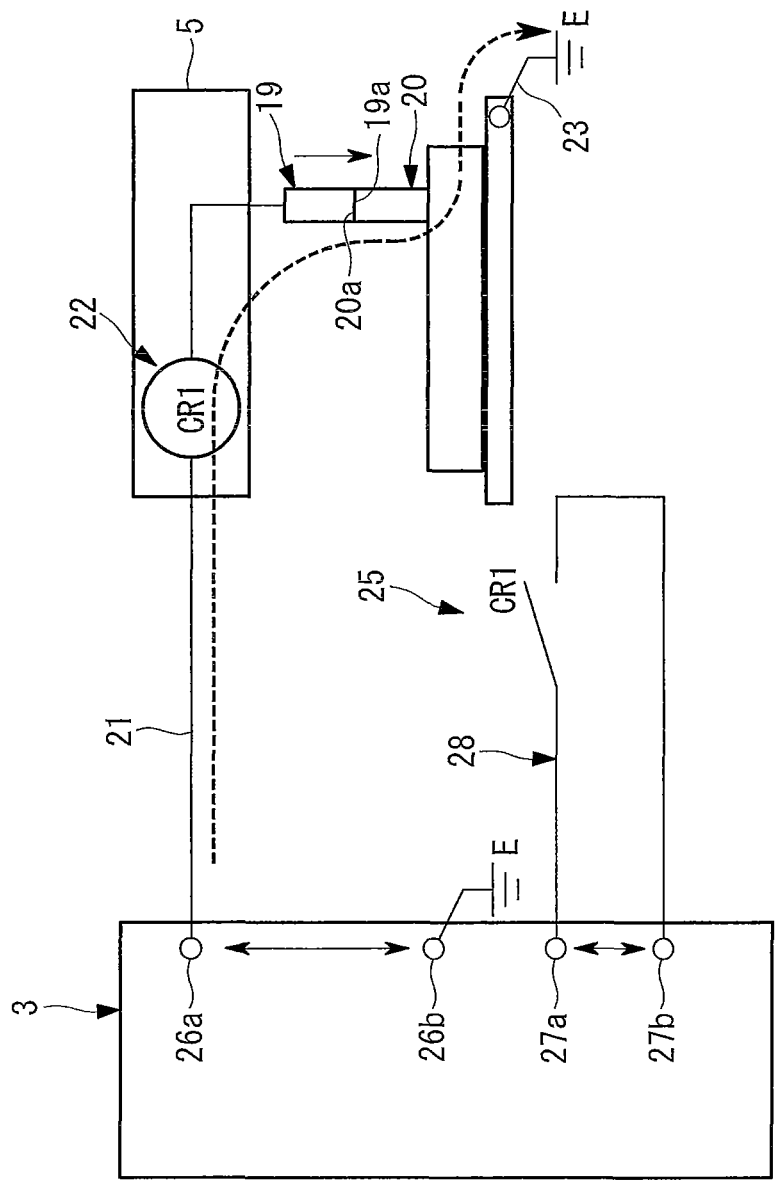
FIG. 3 is a circuit diagram illustrating the operation when a selected hand has been detected in the robot system in FIG. 1.

As shown in FIG. 3, the first electrode 19 is connected to a terminal 26a in the controller 3 via a cable 21. A current detecting unit 22 for detecting electric current flowing in the cable 21 is installed between the first electrode 19 and the terminal 26a of the controller 3.

On the hand stand 4, several types of, for example, in the example shown in FIG. 1, three types of hands 7 are put with the respective attaching/detaching units 18 facing vertically upward. Accordingly, the robot 2 brings the distal end surface 6a of the hand attaching/detaching mechanism 6 at the distal end 5 of the wrist closer to the attaching/detaching unit 18 of any hand 7 from vertically above with the distal end surface 6a facing down, thereby their reference positions match up, and the hand 7 can be fitted into the hand attaching/detaching mechanism 6. Furthermore, also when the hand 7 is detached, the robot 2 moves the hand 7 down to an unoccupied place on the hand stand 4 from vertically above, and the hand attaching/detaching mechanism 6 lets go of the hand 7, and after that, the robot 2 moves the distal end 5 of the wrist vertically upward, thereby can release the hand 7.

Figure 2:
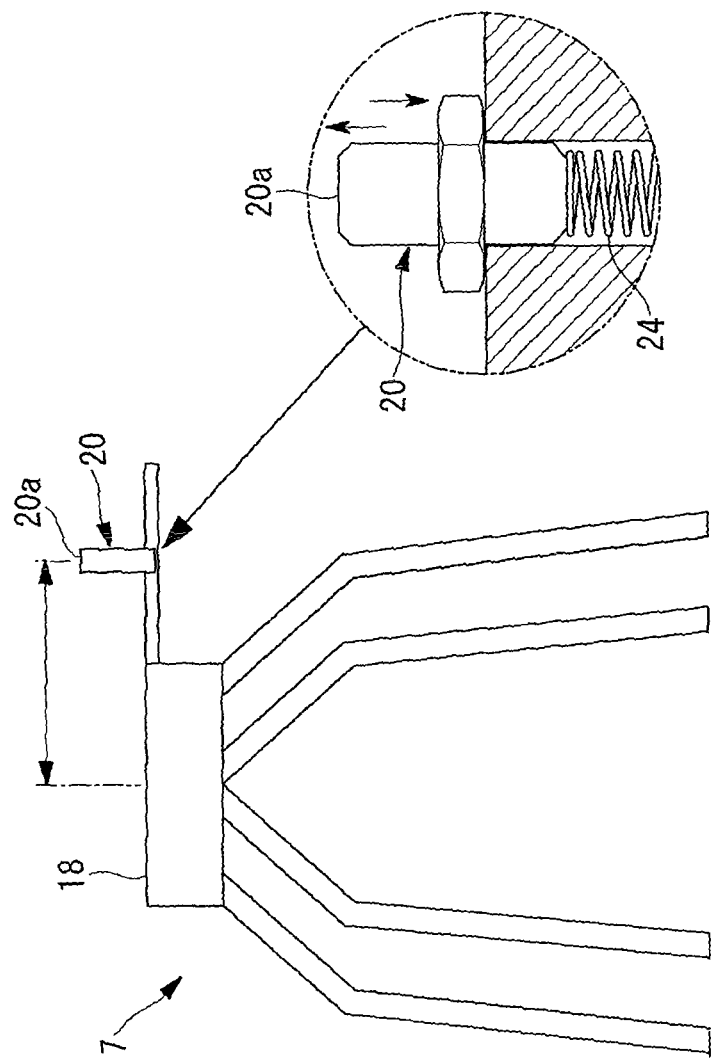
FIG. 2 is a diagram showing an example of a hand put on a hand stand of the robot system in FIG. 1, and shows an enlarged view of a second electrode part as well.

The hands 7 each include the common attaching/detaching unit 18, and also are provided with the rod-like second electrode 20 extending parallel to a center line of the attaching/detaching unit 18 at the position at a distance L1, L2, L3, which is a different distance for each hand 7, from the reference position of the attaching/detaching unit 18, for example, the center line of the attaching/detaching unit 18. When put on the hand stand 4, the second electrode 20 of the hand 7 is, as shown in FIG. 2, placed with its distal-end contact surface 20a facing vertically upward. The contact surface 20a of the second electrode 20 can be electrically connected to the contact surface 19a of the first electrode 19 placed at the distal end 5 of the wrist of the robot 2.

Furthermore, the hand stand 4 includes a ground circuit 23 that grounds the second electrode 20 of the hand 7 put on the hand stand 4 to the ground of the controller 3.

Moreover, as shown in FIG. 2, the second electrode 20 is supported so that the contact surface 20a can move up and down, and is biased vertically upward by a biasing member (a biasing unit) 24 such as a coil spring. Accordingly, after the first electrode 19 has been moved closer from vertically above, and the contact surfaces 19a and 20a have come in contact, when the first electrode 19 is further moved down, the second electrode 20 is also moved down together with the first electrode 19. At this time, the contact state of the contact surfaces 19a and 20a is stably maintained by biasing force of the biasing member 24. Accordingly, a floating mechanism is constructed in the second electrode 20.

The controller 3 stores therein a program for controlling the robot 2, and executes the program, thereby driving the axes 10, 12, 14, 15, 16, and 17 of the robot 2. Furthermore, the controller 3 includes a storage unit (not shown) that stores therein the types of the hands 7 put on the hand stand 4 and the positions of the respective second electrodes 20 in an associated manner. In the present embodiment, as the position of the second electrode 20, for example, the offset amount, which indicates the amount of gap in a horizontal direction between the first electrode 19 and the second electrode 20 in a state where the reference position of the hand attaching/detaching mechanism 6 and the reference position of the attaching/detaching unit 18 of the hand 7 have matched up, is stored.

Furthermore, the controller 3 is provided with a power source (not shown) that supplies voltage for detection to between terminals 26a and 26b in accordance with a command written in the program.

Preferably, for example, a command to supply voltage for detection to the first electrode 19 at the timing after the contact surface 19a of the first electrode 19 has been brought into contact with the contact surface 20a of the second electrode 20 by the movement of the robot 2, i.e., at the timing after the contact surface 19a of the first electrode 19 has been moved down to the position lower than the contact surface 20a of the second electrode 20 is written in the program.

Moreover, the controller 3 is provided with a closed circuit (a hand identifying unit) 28 that is interrupted by a relay 25. The relay 25 is set to close a contact point provided in the closed circuit 28 when the current detecting unit 22 has detected electric current. Accordingly, whether or not electric current has been detected by the current detecting unit 22, i.e., whether or not the contact surface 19a of the first electrode 19 and the contact surface 20a of the second electrode 20 have come in contact can be determined according to whether or not electric current is flowing between terminals 27a and 27b of the closed circuit 28.

Furthermore, the controller 3 is configured to perform a hand identifying operation when a hand selection signal A exists in the program. That is, a hand 7 is selected according to a hand selection signal in the program, so the program composes a hand selecting unit.

Figure 5:
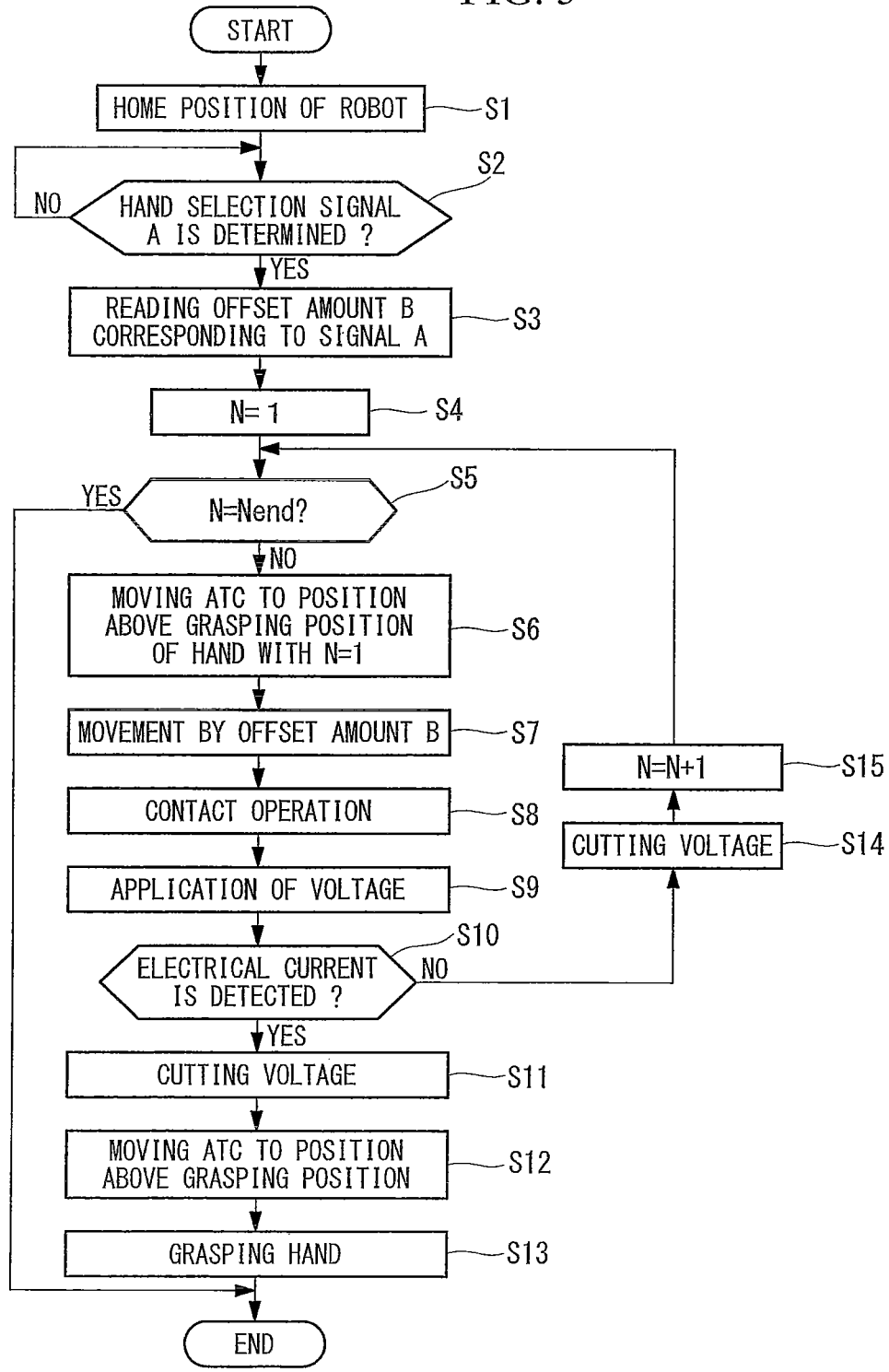
FIG. 5 is a flowchart illustrating a hand identifying operation in the robot system in FIG. 1.

The hand identifying operation is as shown in FIG. 5; the robot 2 is moved to home position (Step S1), and the presence or absence of a hand selection signal A which indicates the type of a hand 7 is determined (Step S2), and, if there is a hand selection signal A, a position (offset amount) B of the second electrode 20 stored in the storage unit in association with the hand selection signal A is read (Step S3).

Figure 4:
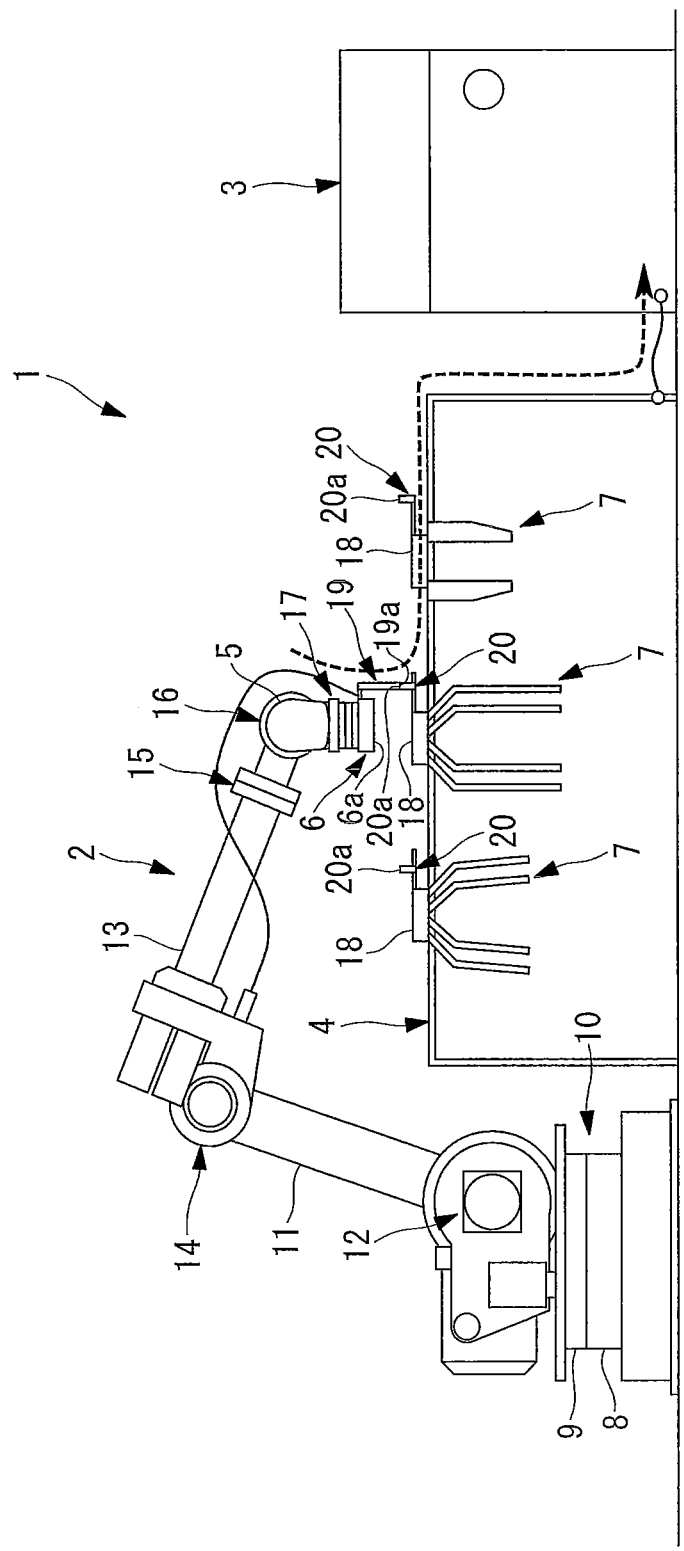
FIG. 4 is an entire configuration diagram illustrating the case where the second hand is detected as a selected hand in the robot system in FIG. 1.

Then, a hand number N is reset to N=1 (Step S4), and whether the hand number N is an end determination number Nend or not is determined (Step S5). In an example shown in FIG. 4, there are three types of hands 7, and Nend=4, which is one more than 3, is set as the end determination number Nend.

As the hand number N is N=1, a result of the determination is NO, and the robot 2 is driven to move the hand attaching/detaching mechanism (ATC) 6 to a position above a grasping position of the hand 7 with N=1 (Step S6). Furthermore, the hand attaching/detaching mechanism 6 is moved by the offset amount B read from the storage unit (Step S7).

From this state, a contact operation to drive the robot 2 to move down the hand attaching/detaching mechanism 6 is performed (Step S8). The contact operation is an operation to move the hand attaching/detaching mechanism 6 down to the position at which the level of the contact surface 19a of the first electrode 19 becomes lower than the level of the contact surface 20a of the second electrode 20.

After this, a voltage applying process of supplying power to the terminals 26a and 26b of the controller 3 is performed (Step S9), and whether or not electric current has been detected by the current detecting unit 22 is determined (Step S10).

If electric current has been detected, the hand 7 indicated in the hand selection signal A is identified to be the hand 7 with hand number N=1. Therefore, the voltage is cut (Step S11), and the hand attaching/detaching mechanism 6 is moved to a position above a grasping position of the hand 7 with N=1 (Step S12) and then is moved down to be fitted with the hand 7 (Step S13).

On the other hand, at Step S10, if it has been determined that no electric current has been detected, the voltage is cut (Step S14), and the hand number N is incremented to N=2 (Step S15), and the processes from Step S5 onward are repeated.

At Step S5, if N=Nend, the operation is terminated without performing the operation to grasp the hand 7.

The action of the robot system 1 configured as above according to the present embodiment is explained below.

According to the robot system 1 according to the present embodiment, the first electrode 19 is placed at the distal end 5 of the wrist of the robot 2, and the second electrode 20 is placed at a different position for each hand 7, and a hand 7 selected from the hands 7 randomly arranged on the hand stand 4 can be identified according to the presence or absence of electric current flowing the closed circuit 28 by the contact between the first electrode 19 and the second electrode 20. Accordingly, there is the advantage that it is possible to identify multiple hands 7 easily and compactly without having to install sensors for hand identification in each of the multiple hands 7.

Furthermore, the floating mechanism is constructed in the second electrode 20, and the stable contact state of the first electrode 19 and the second electrode 20 can be maintained while easing the impact caused when the first electrode 19 and the second electrode 20 come in contact. Accordingly, the lives of the first electrode 19 and the second electrode 20 can be increased, and also it is possible to prevent false detection due to contact failure. Moreover, the establishment of the floating mechanism makes it possible to roughly set teaching points when teaching a program for moving the first electrode 19 to the position in contact with the second electrode 20, and also there is the advantage that the teaching work can be simplified.

Furthermore, as voltage for detection is supplied from the power source installed in the controller 3, another power source does not have to be installed.

Moreover, the closed circuit 28 installed in the controller 3 is open/closed by the relay 25 that is open/closed according to the presence or absence of electric current, thereby the contact between the first electrode 19 and the second electrode 20 is detected; therefore, there is the advantage that an identification circuit for identifying the type of a hand 7 can be composed of a simple electrical circuit.

Furthermore, in the present embodiment, voltage for detection is supplied after the contact surface 19a of the first electrode 19 has been moved down to the position lower than the contact surface 20a of the second electrode 20; therefore, the supply of voltage for detection is confined to the minimum time. Accordingly, there is the advantage that even if the first electrode 19 comes in contact with a member other than the second electrode 20 due to the movement of the first electrode 19 along with the operation of the robot 2, there is no need to apply electrical current.

Incidentally, in the present embodiment, the floating mechanism is constructed in the second electrode 20; instead, the floating mechanism can be constructed in the first electrode 19, or the floating mechanism can be constructed in both the first electrode 19 and the second electrode 20.

Furthermore, there is described the case where three types of hands 7 are put on the hand stand 4; however, the number of the types of hands 7 can be two, or can be four or more.

The inventor has arrived at the following aspects of the present invention.

An aspect of the present invention is to provide a robot system that includes a robot having a hand attaching/detaching mechanism at a distal end of a wrist thereof; a controller for controlling the robot; and a hand stand on which several types of hands to be voluntarily attached to the hand attaching/detaching mechanism of the robot are put and which includes a ground circuit that electrically grounds the hands put on the hand stand to the ground, wherein a first electrode to which detection voltage is applied is fixed to the distal end of the wrist of the robot, wherein each of the hands has a reference position to be a reference when the hand is attached to the hand attaching/detaching mechanism, and is provided with a second electrode so that distance from the reference position to the second electrode differs for each hand, wherein the robot system further comprises a current detecting unit for detecting electric current flowing into the ground circuit of the hand stand, wherein the controller includes: a hand selecting unit for selecting one of the hands; a storage unit that stores the types of the hands and positions of the second electrodes so that the types are associated with the positions, and a hand identifying unit that makes the robot operate to move the first electrode toward each one of the hands put on the hand stand and identifies whether or not the hand is a selected hand selected by the hand selecting unit on the basis of whether or not the electric current is detected by the current detecting unit when the first electrode has been moved to a position corresponding to the position of the second electrode of the selected hand.

According to the present aspect, when a hand to be attached to the hand attaching/detaching mechanism has been selected by the hand selecting unit, the controller controls the robot on the basis of the position of the second electrode stored in the storage unit in association with the selected hand, and makes the first electrode fixed to the wrist closer to the several types of hands put on the hand stand.

At this time, the first electrode is moved to the position corresponding to the position of the second electrode of the selected hand, and, the distance from the reference position of the attaching/detaching unit to the second electrode differs for each hand. Thus, when a hand to which the first electrode is brought closer is not the hand selected, the first electrode does not come in contact with the second electrode. Therefore, even when voltage for detection has been applied to the first electrode, electric current has not been detected by the current detecting unit, and the hand identifying unit identifies that it is not the selected hand.

On the other hand, if the hand that the first electrode has been brought closer to is the selected hand, the first electrode and the second electrode come in contact, and electric current flows into the ground circuit when voltage for detection is applied to the first electrode and is detected by the current detecting unit, and thereby the hand identifying unit identifies that it is the selected hand. Then, when the hand has been identified to be the selected hand, the attaching/detaching unit of the hand is attached to the hand attaching/detaching mechanism fixed to the wrist, thereby the robot can perform the work using the selected hand attached to the wrist.

That is, according to the present aspect, there is the advantage that it is possible to identify multiple hands easily and compactly because it is not necessary to use many sensors for identifying several types of hands.

In the above-described aspect, at least one of the first electrode and the second electrode may be movable so as to move along a direction in which the first electrode and the second electrode become closer, and may include a biasing unit that biases the at least one of the electrodes that moves by contact between the first electrode and the second electrode to a direction opposite to its moving direction.

By doing this, when the first electrode is moved to come into contact with the second electrode by the control of the robot, at least one of the first electrode and the second electrode moves along the direction, in which the electrodes become closer, by pressure caused by the contact, thereby the impact force is reduced. Furthermore, when the electrode is moved by the contact, a biasing force of the biasing unit acts in a direction opposite to its moving direction, and therefore, the close contact state of the first electrode and the second electrode is maintained.

Thus, according to this aspect, the impact force due to the contact is reduced, and the durability of the electrode can be improved, and the teaching of the robot operation for causing the contact between the electrodes does not have to be precisely performed and can be performed easily.

Furthermore, in the above-described aspect, the current detecting unit may include a relay that is released or closed when the electric current flows into the ground circuit.

By doing this, electric current flowing into the ground circuit can be detected by opening/closing of the relay, and an inexpensive electrical circuit for the detection can be constructed.

Moreover, in the above-described aspect, the controller may be configured to control timing to apply the detection voltage to the first electrode.

By doing this, the detection voltage can be applied to the first electrode only at the timing at which the detection of electric current is necessary, and it is possible to prevent electric current from flowing when the first electrode comes into contact with another object other than the second electrode.

Furthermore, the detection voltage may be supplied from a power source installed in the controller.

By doing this, another power source for identifying a hand does not have to be installed.

According to the aforementioned aspects, it is possible to identify multiple hands easily and compactly without having to install sensors for hand identification in each of the multiple hands.

REFERENCE SIGNS LIST

1 Robot system
2 Robot
3 Controller
4 Hand stand
5 Distal end of wrist
6 Hand attaching/detaching mechanism
7 Hand
18 Attaching/detaching unit
19 First electrode
20 Second electrode
22 Current detecting unit
23 Ground circuit
24 Biasing member (biasing unit)
25 Relay
28 Closed circuit (hand identifying unit)

The invention claimed is:

1. A robot system comprising:
a robot having a hand attaching/detaching mechanism at a distal end of a wrist thereof;
a controller for controlling the robot; and
a hand stand on which several types of hands to be voluntarily attached to the hand attaching/detaching mechanism of the robot are put and which includes a ground circuit that electrically grounds the hands put on the hand stand to the ground,
wherein a first electrode to which detection voltage is applied is fixed to the distal end of the wrist of the robot,
wherein each of the hands has a reference position to be a reference when the hand is attached to the hand attaching/detaching mechanism, and is provided with a second electrode so that distance from the reference position to the second electrode differs for each hand,
wherein the robot system further comprises a current detecting unit for detecting electric current flowing into the ground circuit of the hand stand,
wherein the controller includes: a hand selecting unit for selecting one of the hands; a storage unit that stores the types of the hands and positions of the second electrodes so that the types are associated with the positions, and a hand identifying unit that makes the robot operate to move the first electrode toward each one of the hands put on the hand stand and identifies whether or not the hand is a selected hand selected by the hand selecting unit on the basis of whether or not the electric current is detected by the current detecting unit when the first electrode has been moved to a position corresponding to the position of the second electrode of the selected hand.

2. The robot system according to claim 1, wherein at least one of the first electrode and the second electrode is movable so as to move along a direction in which the first electrode and the second electrode become closer, and includes a biasing unit that biases the at least one of the electrodes that moves by contact between the first electrode and the second electrode to a direction opposite to its moving direction.

3. The robot system according to claim 1, wherein the current detecting unit includes a relay that is released or closed when the electric current flows into the ground circuit.

4. The robot system according to claim 1, wherein the controller is configured to control timing to apply the detection voltage to the first electrode.

5. The robot system according to claim 1, wherein the detection voltage is supplied from a power source installed in the controller.

* * * * *